United States Patent [19]

MacDonald et al.

[11] Patent Number: 5,393,375
[45] Date of Patent: Feb. 28, 1995

[54] PROCESS FOR FABRICATING SUBMICRON SINGLE CRYSTAL ELECTROMECHANICAL STRUCTURES

[75] Inventors: Noel C. MacDonald; Zhoying L. Zhang; Gyorgy A. Porkolab, all of Ithaca, N.Y.

[73] Assignee: Cornell Research Foundation, Inc., Ithaca, N.Y.

[21] Appl. No.: 171,965

[22] Filed: Dec. 22, 1993

Related U.S. Application Data

[63] Continuation of Ser. No. 829,348, Feb. 3, 1992, abandoned.

[51] Int. Cl.$^6$ ............................................. B44C 1/22
[52] U.S. Cl. ........................................ 156/643; 437/5; 437/241; 437/978; 148/DIG. 135
[58] Field of Search ................ 156/643; 437/203, 974, 437/978, 241; 148/DIG. 135

[56] References Cited

U.S. PATENT DOCUMENTS

| 3,383,760 | 5/1968 | Shwartzman | 437/67 |
|---|---|---|---|
| 3,859,178 | 1/1975 | Logan et al. | 148/DIG. 118 |
| 4,417,946 | 11/1983 | Bohlen et al. | 156/643 |
| 4,437,226 | 3/1984 | Soclof | 437/67 |
| 4,561,932 | 12/1985 | Gris et al. | 156/643 |
| 4,670,092 | 6/1987 | Motamedi . | |
| 4,776,924 | 10/1988 | Delapierre . | |
| 4,814,287 | 3/1989 | Takemoto et al. | 437/67 |
| 4,845,048 | 7/1989 | Tamaki et al. | 437/67 |
| 5,072,288 | 12/1991 | MacDonald et al. . | |
| 5,112,771 | 5/1992 | Ishii et al. | 437/67 |
| 5,156,988 | 10/1992 | Mori et al. | 437/927 |
| 5,198,390 | 3/1993 | MacDonald et al. | 437/203 |

FOREIGN PATENT DOCUMENTS 60-245144 12/1985 Japan .................................. 437/67
2222160 9/1990 Japan .................................. 437/67

OTHER PUBLICATIONS

"Fabrication of High Frequency Two-Dimensional Nanoactuators for Scanned Probe Devices" J. Jason Yao et al, Journal of Microelectromechanical Systems, vol. 1, No. 1, Mar. 1992 pp. 14–22.

"Formation of Submicron Silicon-on-Insulator Structures by Lateral Oxidation of Substrate-Silicon Islands" Susanne Arney et al, J. Vac. Sci. Technol. B6(1), Jan.-/Feb. 1988, pp. 341–345.

"New SOI CMOS Process with Selective Oxidation" Kubota et al, IEDM 86 pp. 814–816.

"Anisotropic Reactive Ion Etching of Aluminum Using $Cl_2BCl_3$, and $CH_4$ Gases" Lutze et al, J. Electrochem. Soc., vol. 137, No. 1, Jan. 1990 pp. 249–252.

"Anistropic Reactive Ion Etching of $MoSi_2$ and In Situ Doped n+ and p+ Polysilicon Using $Cl_2$ and $BCl_3$" Mele et al J. Electrochem. Soc.: Solid-State Science and Tech Sep. 1988 pp. 2373–2378.

"Nanostructures in Motion" J. J. Yao et al Invited Paper International Symposium on Nanostructures and Mesoscopic Systems, NANOMES '91, Sante Fe, N.M., May 20–24, 1991 9 pages.

*Primary Examiner*—Tom Thomas
*Assistant Examiner*—Michael Trinh
*Attorney, Agent, or Firm*—Jones, Tullar & Cooper

[57] ABSTRACT

A process for fabricating submicron movable mechanical structures utilizes chemically assisted ion beam etching and reactive ion etching which are independent of crystal orientation. The process provides released mechanical structures which may be of the same material or of different materials than the surrounding substrate, and a nitride coating may be provided on the released structure for optical applications.

18 Claims, 3 Drawing Sheets

PROCESS FOR FABRICATING SUBMICRON SINGLE CRYSTAL ELECTROMECHANICAL STRUCTURES

This invention was made with Government support under Grants Nos. ECS-8619049, ECS-8805866 and ECS-8815775 awarded by the National Science Foundation. The Government has certain rights in the invention.

This application is a continuation of application Ser. No. 829,348, filed Feb. 3, 1992, now abandoned.

BACKGROUND OF THE INVENTION

The present invention relates, in general, to a new process for the fabrication of submicron, movable mechanical structures, and more particularly to a simplified single-crystal reactive etching process for such structure which is independent of crystal orientation and which produces controllable vertical profiles in the crystal.

Recent developments in micromechanics have successfully led to the fabrication of microactuators utilizing processes which have involved either bulk or surface micromachining. The most popular surface micromachining process has used polysilicon as the structural layer in which the mechanical structures are formed. For such a polysilicon process, a sacrificial layer is deposited on a silicon substrate prior to the deposition of the polysilicon layer. The mechanical structures are defined in the polysilicon, and then the sacrificial layer is etched partially or completely down to the silicon substrate to free the polysilicon movable mechanical structures. Such polysilicon technology is not easily scaled for the formation of submicron, high aspect-ratio mechanical structures, because it is difficult to deposit fine-grain polysilicon films to the required thickness.

Some bulk micromachining processes can yield mechanical single-crystal silicon structures using wet chemical etchants such as EDP, KOH, and hydrazine to undercut single-crystal silicon structures from a silicon wafer. However, such processes are dependent on crystal orientation within the silicon wafer, and for this and other reasons the type, shape and size of the structures that can be fabricated with the wet chemical etch techniques are severely limited.

The use of single-crystal materials for mechanical structures can be beneficial, since these materials have fewer defects, no grain boundaries and therefore can be scaled to submicron dimensions while retaining their structural and mechanical properties. Also, the use of single-crystal materials, particularly single-crystal Silicon (Si), Silicon Germanium (SiGe), Indium Phosphene (InP) and Gallium Arsenide (GaAs), to produce mechanical sensors and actuators can facilitate and optimize electronic and photonic system integration. Single crystal gallium arsenide (SC-GaAs) in particular is an attractive material for micromechanics because of its optoelectronics properties. Furthermore, the use of SC-GaAs to produce mechanical sensors and actuators permits the integration of mechanical, electronic and photonic devices, However, the brittleness and the thermal expansion mismatch between dielectric thin films and SC-GaAs complicate the fabrication of three-dimensional GaAs mechanical structures.

In copending U.S. application Ser. No. 07/821,944, of Noel C. MacDonald and Zuoying L. Zhang, filed Jan. 16, 1992, U.S. Pat. No. 5,198,390 and entitled "RIE Process for Fabricating Silicon Electromechanical Structures", a reactive ion etching process is disclosed for the fabrication of submicron, single-crystal silicon movable micromechanical structures. That process, known as a single-crystal reactive etch and metallization process (SCREAM), provides a significant advantage in the manufacture of silicon structures since no thick film deposition process is required. Instead, reactive ion etching (RIE) processes are used to fabricate released SCS structures with lateral feature sizes down to 250 nm and with arbitrary structure orientation on an SCS wafer. The SCREAM process includes options to make integrated, side-drive capacitor actuators, the capacitor actuators being formed by means of a compatible, high step-coverage metallization process using aluminum sputter deposition and isotropic aluminum dry etching. The metallization process is used to form side drive electrodes and complements the silicon RIE processes used to form these structures.

In general, the SCREAM process of that application defines mechanical structures with one mask, with the structures being etched from a substrate. In one embodiment of the invention, the starting substrate is a silicon wafer on which a layer of silicon dioxide approximately 400 nm thick is thermally grown, this material then being available for use as an etch mask. The pattern to produce free standing SCS structures is created using photolithography in a photoresist spun on the silicon dioxide layer, and this photoresist pattern is transferred to the silicon dioxide by a reactive ion etching step. The photoresist is then stripped and the silicon dioxide pattern is transferred to the silicon substrate using a second RIE process, forming trenches and islands in accordance with the desired structural features in the silicon. As an option, contact windows may be opened in the silicon dioxide to allow electrical contact to both the silicon substrate and the movable silicon structures, and thereafter a 400 nm layer of aluminum is conformally deposited using DC magnetron sputter deposition. This aluminum makes electrical contact with the silicon substrate and with the movable silicon structures through the contact windows, while the remainder is deposited on the silicon dioxide layer, A photoresist is used to re-fill the etched silicon trenches following this aluminum sputter deposition and thereafter aluminum side electrode patterns are produced in the photoresist through the use of photolithography. This pattern is then transferred to the aluminum layer by means of an isotropic RIE, with the photolithography and RIE steps producing smooth edges on the aluminum pattern.

After the aluminum electrodes are patterned, an etching step removes the silicon dioxide on the bottoms of the trenches, while leaving the silicon dioxide on the top and side walls of the structures previously defined in the substrate. The silicon mechanical structures are released from the silicon substrate using a further RIE process, with the top and side walls of the structures being protected by the silicon dioxide mask during undercutting. Finally, the resist which was used for the aluminum patterning is stripped from the structure by a suitable plasma etch.

The foregoing process as described in the aforesaid copending patent application, can be used to fabricate complex polygonal shapes, including triangular and rectangular structures, as well as curved structures such as circles, ellipses and parabolas in single-crystal silicon. Such structures can include integrated, high aspect-ratio and conformable capacitor actuators, as required. Thus, it is possible to form suspended SCS structures with complex shapes from a silicon wafer through a simplified RIE process.

The foregoing process relies upon the formation of a silicon dioxide layer on the single-crystal silicon material; however, it is often desirable to utilize materials in addition to silicon, such as GaAs, SiGe and InP, as well as superlattices in such structures, as noted above, but such other materials do not generate an oxide layer in the manner of silicon. Accordingly, a different process is required to produce released micromechanical structures in materials other than silicon.

BRIEF DESCRIPTION OF THE INVENTION

It is, therefore, an object of the present invention to provide suspended micromechanical structures utilizing a fabrication technique which is compatible with a wide range of materials.

It is another object of the invention to fabricate high aspect-ratio mechanical structures having feature sizes as small as 250 nm from single-crystal substrates, and wherein the structures may have any arbitrary structural orientation on the substrate independently of crystal orientation.

A still further object of the invention is to provide a new process for producing movable mechanical structures from single-crystal materials such as gallium arsenide, silicon germanium, and indium phosphene, as well as from superlattice materials.

Another object of the invention is to provide suspended, movable microstructures of any material within a substrate.

Briefly, the present invention is directed to a process for fabricating submicron electromechanical or optoelectromechanical devices. Chemically assisted ion beam etching (CAIBE) and/or reactive ion beam etching (RIBE) is used to make deep vertical structures on a substrate such as single-crystal GaAs, and thereafter reactive ion etching (RIE) is used to laterally undercut the structure. If desired, a small connecting pillar may be left between the structure and the substrate, for mechanical support, for electrical connection, or for providing a thermally conductive path between the structure and the substrate for cooling; preferably, however, the RIE etch fully undercuts the structure to release it for mechanical motion with respect to the substrate. A self-aligned plasma enhanced chemical vapor deposited $SiN_X:H$ (PECVD-$SiN_X:H$) and PECVD-$SiO_X:H$ preferably are used for masking the top and sidewalls of the microstructure and for electrical isolation. The nitride masking layer is compatible with GaAs as well as other materials, and can be used in the formation of a wide variety of structures. Nitride layers may particularly be used to encapsulate optoelectronic components.

In a preferred form of the invention, the microstructure is of GaAs, and is fabricated from a single-crystal gallium arsenide substrate. The microstructure is released from the substrate by the RIE process so that it is movable with respect to it. The GaAs structure may have an aspect-ratio of, for example, 25:1 and may have a vertical depth of at least 10 $\mu$m and a lateral width of 400 nm or less. The SC-GaAs structure may be freely suspended above the substrate by a 1–10 $\mu$m clearance.

The CAIBE and/or the RIBE processes of the present invention are independent of crystal orientation and produce controllable vertical profiles in the substrate with mirror finishes of the type compatible with laser devices. The released structure may be in the form of one or more cantilevered arms each having one end supported on a fixed structure with the opposite end being free and movable horizontally or vertically, or may be in the form of a two-dimensional crossed beam structure spring-mounted to be movable in X, Y and Z directions.

In one embodiment of the invention the movable structure may provide a support for a covering membrane, formed, for example, by a deposited layer of silicon nitride or silicon dioxide or by deposited layers of metals and insulators. Such a membrane may serve as a pressure sensor, microphone, ultrasonic detector, or the like.

In another embodiment of the invention, the movable structure can be constructed from materials other than the crystal material of the substrate. For example, since the process of the invention is compatible with microfabrication processes such as those used in making photonic devices and integrated circuits, the movable structure can be fabricated on graded index, separate confinement, heterostructure quantum well (GRIN-SCH-QW) materials, including GaAs and SiGe superlattice and heterojunction structures. This allows the formation of movable structures having vertical etched mirrors and ridge waveguides to produce movable semiconductor lasers. The CAIBE and RIBE processes provide smooth, vertical etched facets for making waveguides and since the process is independent of crystalline structure the components can be placed arbitrarily on the substrate. The nitride masking layer used in the fabrication of the microstructure protects all of the layers forming the laser structure, thereby permitting the use of an etching step to release the structure while leaving the nitride layer in place.

The self-aligned anisotropic and isotropic dry etch processes allow formation of small diameter SC-GaAs columns which can be laterally over-etched to create complex structures. The process also can incorporate an integrated sidewall metallization process to provide electrically isolated, vertical sidewall capacitor actuators or sensor, and to provide electrical contacts and conductors. Various metals can be used for such contacts to provide ohmic and Schottky contacts as required for the fabrication of optoelectronic and photonic devices. Self-aligned undercut mesa structures made by vertical and undercut etches in SC-GaAs also can be used to make contacts on both the mesa top and in the trenches surrounding the mesas in a single metal deposition. Conformed layers of nitride can be provided to surround the released structures, if desired.

Although silicon nitride is preferred as the masking and protective layer, other materials such as CVD silicon carbide (SiC) or CVD silicon dioxide ($SiO_2$) can be used, for example, to achieve better thermal expansion matching when substrate materials such as GaAs or SiGe, or Si, are used.

BRIEF DESCRIPTION OF THE DRAWINGS

The foregoing and additional objects, features and advantages of the present invention will become apparent to those of skill in the art from the following more detailed description of the invention taken in conjunction with the accompanying drawings, in which.

DESCRIPTION OF PREFERRED EMBODIMENTS

Figure 1A:
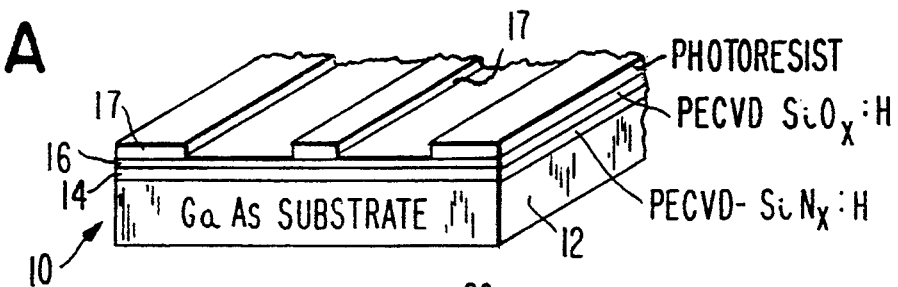
FIGS. 1A–1F illustrate in diagrammatic form the fabrication of a cantilever beam from a gallium arsenide wafer and the provision of aluminum electrodes adjacent each side of the beam, the process utilizing a nitride layer for electrical insulation and for providing top and sidewall etching masks.

In accordance with the present invention a single-crystal reactive etch and metallization process is used to fabricate a variety of complex circular, or complex polygonal structures in a single-crystal material such as GaAs, SiGe, or InP. In this process, mechanical structures are defined with one mask and are then etched from the single-crystal material, which will be described below in terms of a gallium arsenide wafer. The process steps of the invention for fabricating single-crystal electro-mechanical structures are diagrammatically illustrated in FIGS. 1A through 1F, to which reference is now made. These figures show the process sequence for the fabrication of a straight cantilever beam and integrated aluminum electrodes adjacent each side of the beam, but it will be understood that various other shapes can be fabricated by the same process. As illustrated in FIG. 1A, the starting substrate 10 includes, in a preferred form of the invention, a silicon-doped $(2 \times 10^{18} \text{ cm}^{-3})$, (100), polished SC-GaAs wafer 12. The wafer may be an inexpensive, commercial bulk SC-GaAs, and may have an etch pit density (EPD) of between 6,000 and 10,000. A 200 nm layer 14 of $SiN_X:H$ and a second, 150 nm layer 16 of $SiO_X:H$ are deposited by plasma enhanced chemical vapor deposition (PECVD) on the top surface of the GaAs substrate 12 to form a dielectric stack. Layer 16 is patterned in the shape of the desired micromechanical structure, as by way of a conventional photolithographic process on a photoresist layer which is spun onto the silicon dioxide layer 16. The desired pattern 17 is then created in the photoresist layer as indicated in FIG. 1A, with a minimum lateral feature size for the microstructure, such as the cantilever beam structure defined by this process, being, for example, about 400 nm.

Figure 1B:
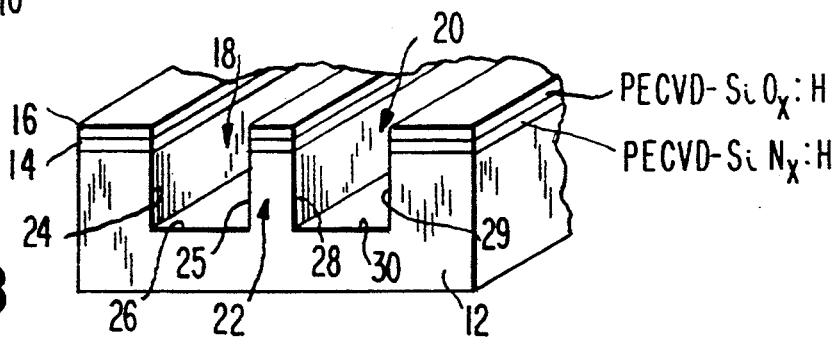

As illustrated in FIG. 1B, the pattern 17 of the photoresist mask layer is transferred to the PECVD-$SiO_X:H$ layer 16 and PECVD-$SiN_X:H$ layer 14 of the dielectric stack by reactive ion etching (RIE) in a $CHF_3/O_2$ plasma etch. The pattern in the layers 14 and 16 is subsequently transferred to the GaAs substrate 12 using chemically assisted ion beam etching (CAIBE). Preferably, the CAIBE uses a 500 eV, 0.1 mA/cm$^2$ Argon ion beam and a flow of $Cl_2$ gas at 10 ml/min. It is also possible to use reactive ion beam etching (RIBE) for this step, the particular etching process which is preferred depending upon the material being etched. The illustrated etch mask defines a pair of trenches 18 and 20 in the surrounding GaAs wafer, the trenches being disposed on opposite sides of an island (or mesa) 22 and defining the width, length, depth and shape of the island. The CAIBE process or the RIBE process produces smooth, vertical, opposed side walls 24 and 25 and a bottom wall 26 defining trench 18 and smooth, vertical, opposed side walls 28 and 29 and a bottom wall 30 defining trench 20, with walls 25 and 28 defining the island 22 from which the cantilever beam is to be formed. An etch depth of greater than 10 micrometers is possible with the above-disclosed process, while still retaining the required vertical wall structure. The photoresist mask 17 is then stripped by an $O_2$ plasma.

Figure 1C:
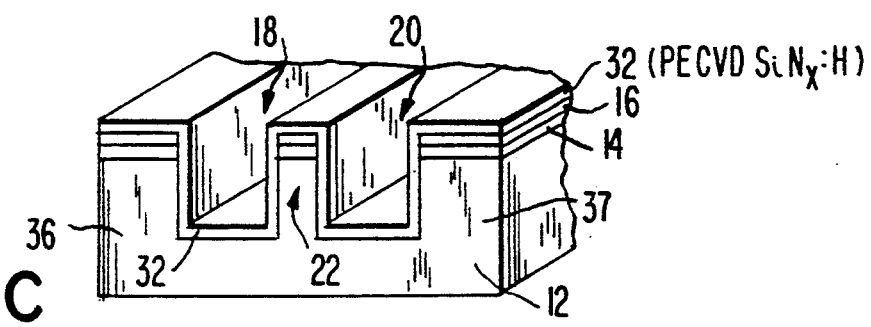

Following the SC-GaAs etch of FIG. 1B, a PECVD-$SiN_X:H$ layer 32 is conformally deposited to a thickness of, for example, 300 nm to cover all of the exposed surfaces. Thus, as illustrated in FIG. 1C, layer 32 covers the PECVD-$SiO_X:H$ layer 16 on the horizontal top surface of the wafer 10, covers the bottom walls 26 and 30, and covers the side walls 24, 25, 28 and 29 of trenches 18 and 20. The use of a nitride for layer 32 protects the sidewalls of the island 22, since the nitride is compatible with the GaAs.

Figure 1D:
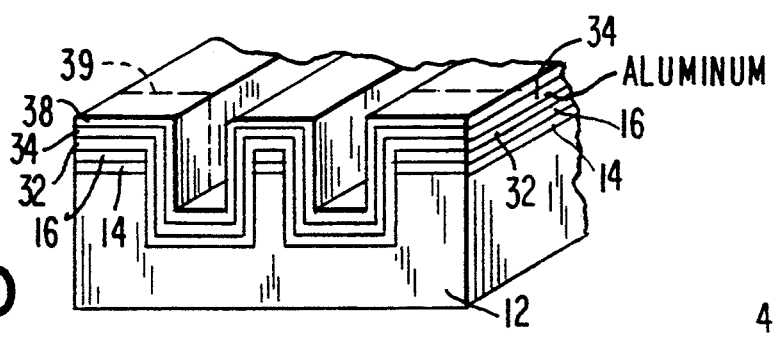

As illustrated in FIG. 1D, the next step in the fabrication process is the optional deposition of a 400 nm thick layer 34 of aluminum. This layer is conformally deposited over all of the exposed surfaces by means of, for example, DC magnetron sputter deposition and thus covers the nitride layer 32. The aluminum deposition and the following aluminum masking steps are used where it is desired to provide electrical contact with the substrate or to provide aluminum electrodes for providing electric or magnetic fields at the movable microstructure for sensing or controlling the structure.

Although in FIG. 1D the aluminum layer 34 is shown as being deposited over layer 32, it may be desirable to provide selected contact windows, or apertures, in layer 32 prior to the aluminum deposition step. Such windows can be formed by means of a second photoresist and photolithographic step (not illustrated) to pattern the location of points where electrical contact is to be made with the underlying GaAs substrate 12, and by etching through layer 32 (and layers 14 and 16) to expose the substrate at the desired locations. Thereafter, when the aluminum layer 34 is deposited on the wafer 10, the aluminum will make electrical contact with the substrate through these defined windows. Such contact can be made on the island 22 or on the adjacent substrate regions, or steps, generally indicated at 36 and 37 in FIG. 1C.

After the aluminum layer 34 has been deposited, a photoresist material 38 is spun onto the wafer to re-fill the etched deep trenches 18 and 20 (FIG. 1D). The photoresist material is patterned through conventional photolithography and a side-electrode pattern generally indicated by dotted lines 39, is transferred to the aluminum layer 34 from the resist by an isotropic reactive ion etching step using a $Cl_2/BCl_3$ plasma. This patterning and etching process leaves aluminum electrodes, such as the electrodes 40 and 42, on the walls 24 and 29, respectively (FIG. 1E) while removing the aluminum from remaining surfaces. The photolithography and the aluminum reactive ion etching steps produce smooth edges on the aluminum contact regions over the topography of the wafer, which may include any number of trenches such as trenches 18 and 20. This process removes the aluminum isotropically where the photoresist pattern had been developed, leaving the aluminum layer in a desired configuration to provide the desired field for the island 22.

Figures 1E, 1F:
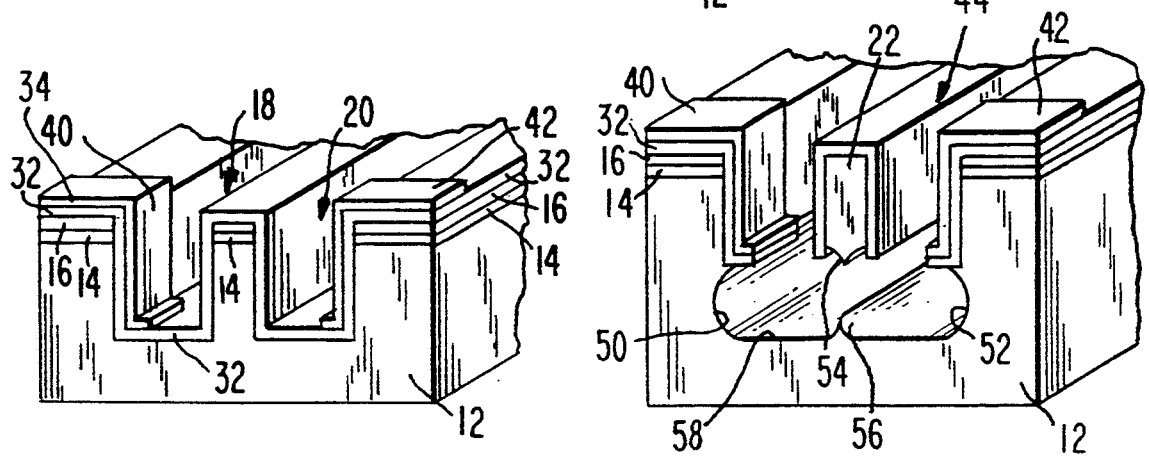

Upon completion of the patterning and formation of the aluminum electrodes illustrated in FIG. 1E, a $CHF_3/O_2$ plasma is used to etch back the exposed PECVD-$SiN_X:H$ layer 32. Anisotropic etch profiles are preferred for the etchback of layer 32 to remove this layer from the bottom walls 26 and 30 of the trenches, and from the top surfaces of the steps 36 and 37 (except where masked by the aluminum contact 42 when such a contact is provided), but to retain layer 32 on the side walls 24, 25, 28 and 29. This also leaves the $SiO_X$:H layer 16 and the $SiN_X$:H layer 14 on the top surface of island 22 and on the top surfaces of steps 36 and 37.

Upon removal of the layer 32 from the bottom walls 26 and 30, a chlorine-based reactive ion etching process is used to undercut the island 22 by etching back the GaAs substrate 12 at the bottoms of the trenches. This process utilizes, for example a $BCl_3$ gas at low plasma power, for example, at a D.C. bias of −75 v, which laterally undercuts the island 22 below the protective mask provided by the layer 32 on walls 25 and 28. This releases the island 22 to form a cantilever beam structure such as the released beam 44 generally indicated in FIG. 1F, with low GaAs surface damage. The undercutting process produces undercut cavities 50 and 52 in the substrate material 12 extending from the trenches 18 and 20, respectively. The undercutting action produces opposed spaced ridges 54 and 56 on the bottom of beam 44 and on the bottom surface 58 of the cavities, respectively. As noted, the cavities are formed through the bottoms of the adjoining trenches 18 and 20 with the etching process continuing beneath the protective layer 32 on the side walls to undercut not only the island 22 to form the released beam 44, but also to undercut the side walls 24 and 29, as illustrated in FIG. 1F. The PECVD-$SiO_X$:H layer 16 exposed on the top surfaces of the wafer 12 by the removal of layer 32 will be consumed by the GaAs etching step.

As a final step, the photoresist used for the aluminum patterning is stripped by an $O_2$ plasma etch. If desired, the nitride layer 32 can be removed from the movable beam or in the alternative an additional conformal nitride layer can be added to cover the bottom surface of the beam where it was exposed by the release etch step.

The contact plates formed by the foregoing process, such as the plates 40 and 42, may be used as capacitor plates to provide conformable capacitor actuators for the beam 44. These capacitor plates can be fabricated at any desired location along side walls or other structures opposite the beam 44 for control of the motion of the beam, for sensing its motion, or for other purposes. Such contacts can be provided on the beam, as well, and can also be provided in a variety of locations for controlling or sensing the motion of a wide range of mechanical structures.

FIGS. 2A to 2E illustrate a process similar to that of FIGS. 1A-1F, but omitting the aluminum contacts. In addition, FIGS. 2A to 2F illustrate the provision of a multilayer heterojunction movable structure, which may be, for example, a laser and in addition illustrate a final step of depositing a conformed nitride layer on the released structure to protect it on its bottom surface, as well as on the side and top walls.

Similar elements are given the same numbers in FIGS. 2A-2F as were given in FIGS. 1A-1F for ease of reference. Thus, in FIG. 2A, the GaAs substrate 12 is covered by the dielectric stack consisting of layers 14 and 16, and a photoresist pattern mask 17 is formed on top of layer 16. The trenches 18 and 20 are formed in the substrate 12 (FIG. 2B), and the mesa, or island 22 is formed between the trenches. In this case, the central GaAs mesa may be fabricated to have multiple layers for example to form a laser using known fabrication techniques in GaAs material. The CAIBE etching process used in the present invention to produce the vertically etched walls 25 and 28 on island 22 is compatible with the laser fabrication process, and forms the mirrored sidewalls required for laser operation.

A nitride layer 32 (FIG. 2C) covers the surface of the wafer and is etched back (FIG. 2D) to expose the bottom walls 26 and 30 of the trenches. This etching also removes layer 32 from the top surface of island 22 and from the top of the side steps 36 and 37, etching back the layer 32 on the side walls only slightly, as indicated at 70 in FIG. 2D.

Figure 2A:
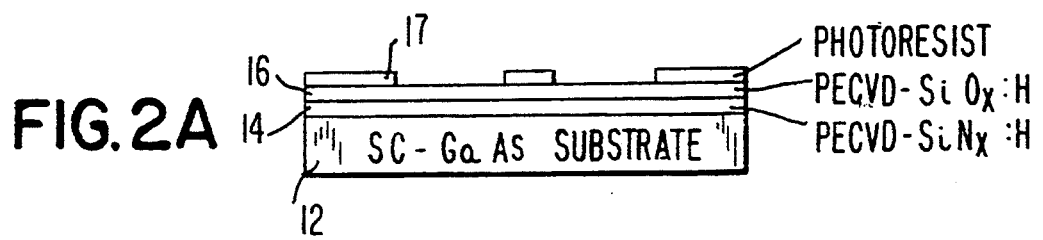
FIGS. 2A–2F illustrate in diagrammatic form the fabrication of a cantilever beam having a multiple layer or superlattice structure within a gallium arsenide wafer, the process utilizing a nitride layer for electrical insulation and masking.
Figure 2B:
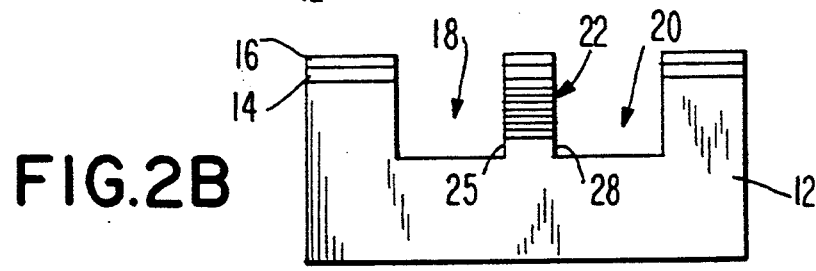
Figure 2C:
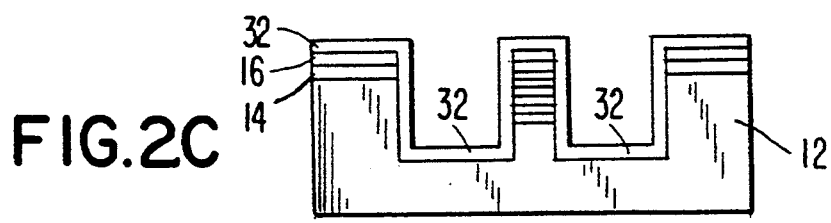
Figure 2D:
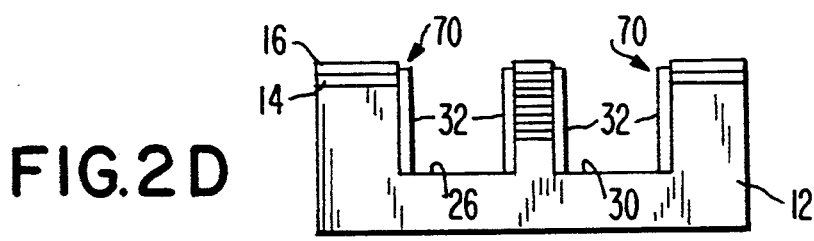
Figure 2E:
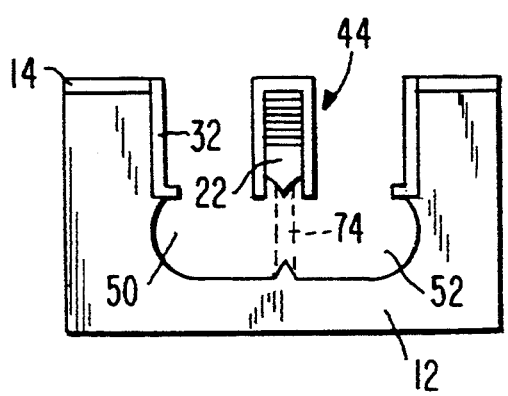
Figure 2F:
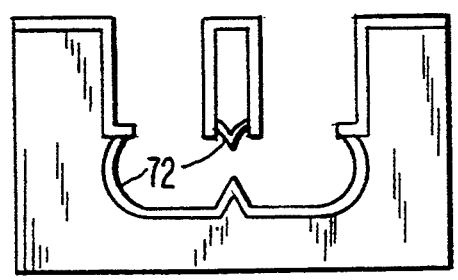

The substrate 12 is etched, at FIG. 2E, as previously described, to form cavities 50 and 52 and to release the island 22 to form a movable beam generally indicated at 44. This step also removes the exposed layer 16, leaving the top and side walls of the beam and the steps covered by a nitride layer such as $SiN_X$:H layers 14 and 32.

If the island 44 is fabricated as an optical device such as a laser, it is desirable to deposit a conformal layer 72 of $SiN_X$:H on the device, as by chemical vapor deposition to insure that the bottom wall of beam 44 is covered by nitride.

It will be understood that although the drawings illustrate the formation of a cantilever beam, various other released structures may be provided, using the herein-disclosed process. Furthermore, as illustrated by the dotted lines 74 in FIG. 2E, in some cases it may be desirable to stop the release etching step before the island is completely released, leaving a pedestal extending between the substrate 12 and the island 22. Such an island can provide a thermally and/or electrically conductive path between the structure 22 and the substrate to mechanically secure the island, or to provide a cooling path.

Figure 3:
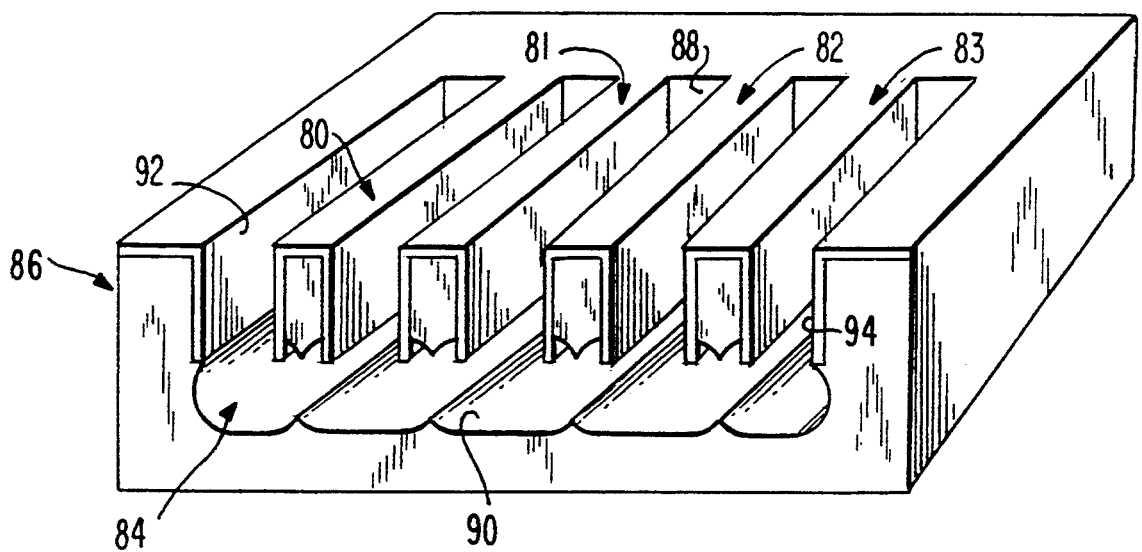
FIG. 3 illustrates a microstructure having a plurality of parallel cantilever beams.

Although the processes illustrated in FIGS. 1A-1F and 2A-2F include only a single cantilevered beam, a wide variety of microstructures can be fabricated by the foregoing processes. Thus, the released structure can be circular or oval, for example, with spaced locations being supported on side walls of a substrate, or supported on spaced pedestals extending upwardly from the substrate floor. Additionally, triangular, rectangular or other polygonal structures can be formed and supported in a similar manner. One such variation of the beam structure is illustrated in FIG. 3, wherein a plurality of parallel, spaced cantilever beams 80-83 are fabricated within an aperture 84 formed within a substrate 86. Each of the beams is fabricated in accordance with the processes described above in FIGS. 2A-2F, for example, with the beams being located in a parallel arrangement defined by the mask 17. As illustrated in FIG. 3, the beams 80-83 are secured at one end to a wall 88 and extend outwardly therefrom to provide free ends which are spaced above the bottom wall 90 of aperture 84. The free ends of the beams are movable with respect to the bottom wall, and that motion may be controlled or sensed by means of suitable electrodes formed on the side walls 92 and 94 if desired, in the manner described with respect to electrodes 40 and 42 in FIGS. 1A-1F. In addition, suitable control or sensing electrodes may be provided on the beams themselves.

Figure 4:
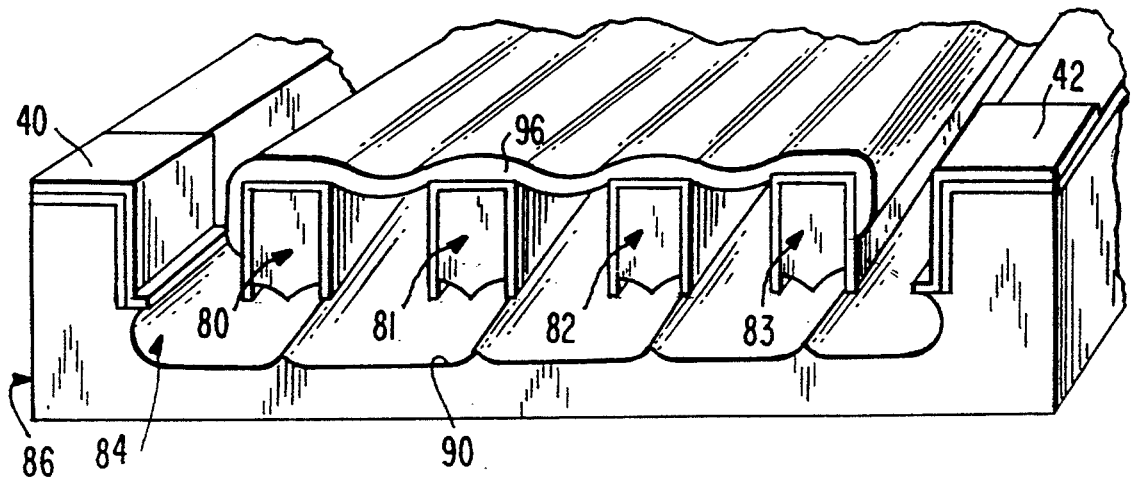
FIG. 4 illustrates a movable membrane utilizing the beam structure of FIG. 3.

As illustrated in FIG. 4, the beams 80-83 may be sufficiently closely spaced that a layer 96 may be deposited over the tops of the beams to form a membrane which joins the beams together. Such a membrane may be formed, for example, from silicon dioxide applied by chemical vapor deposition to the tops of the beams 80-83. The beams are spaced sufficiently closely together that the deposited SiO$_2$ spans the openings between the beams to produce a continuous membrane. This membrane is movable with the free ends of the beams, and this motion may be detected by means of capacitive plates 40 and 42 formed in accordance with the process of FIGS. 1A–1F. Such a membrane may be sensitive to pressure variations, may serve as microphones, and may serve as ultrasonic detectors, among other things.

The membrane may be applied before releasing the beams or after releasing them. Alternative materials such as CVD silicon nitride or sputter deposited layers of metals and insulators may also be used to form the membrane.

The foregoing process for producing a movable membrane microstructure which may be incorporated in a substrate provides a significant advantage, for it permits such a structure to be fabricated from the top (or front) surface of a wafer. This avoids the necessity of etching a recess from the back surface of a substrate in order to form a membrane.

Although the present invention is described primarily with respect to GaAs substrates, it will be understood that the process can be used with other substrate materials and with suitable changes in the etching chemistry. Thus, for example, the beams may be formed to incorporate a GaAs superlattice or heterojunction, or may be formed from a substrate material such as SiGe or InP. Further, the beams formed from such substrate materials may also incorporate superlattices or heterojunctions. Silicon germanium can be etched with a CH$_4$ reactive ion beam, or a Cl$_2$-RIE can be used for deep vertical etching. Lateral undercutting of SiGe can be by SF$_6$-RIE.

The silicon nitride dielectric layer can be replaced with materials such as CVD silicon carbide (SiC) or CVD silicon dioxide (SiO$_2$), for example, where a better thermal expansion match to GaAs or SiGe is required. It is also to be noted that, if desired, the final lateral undercut release step can be performed by a wet etching step.

Although the present invention has been described in terms of preferred embodiments, numerous variations and modifications will be apparent to those of skill in the art. Thus, for example, crossed beam structures mounted by means of springs may be provided to produce a structure movable in an X-Y plane with respect to the surface of the GaAs substrate from which it is formed. Such a structure can serve as an X-Y stage in a scanning electron microscope, or can provide a wide range of sensor and actuator functions. Accordingly, the true scope of the present invention is limited only by the following claims:

What is claimed is:

1. A process for fabricating, from a single crystal substrate, a high aspect ratio, released, single-crystal microstructure having any arbitrary structural orientation with respect to the substrate, comprising:
   providing a substrate of single-crystal material from which a microstructure is to be fabricated;
   depositing by plasma enhanced chemical vapor deposition of silicon nitride a first layer of a dielectric stack on a top surface of said substrate;
   depositing by plasma enhanced chemical vapor deposition of silicon dioxide a second layer of said dielectric stack on a top surface of said first layer;
   forming in said dielectric stack a pattern of the microstructure to be fabricated;
   transferring said pattern to said substrate by ion beam etching to form trenches having bottom walls and vertical side walls in the substrate, the trenches defining mesas having the location, shape and dimensions of the microstructure;
   conformally coating said substrate with a dielectric material to form a third layer on said second layer, on said trench bottom walls, and on said vertical side walls;
   etching back said third layer from the bottom walls of said trenches; and
   releasing said mesas to produce said microstructure from said substrate.

2. The process of claim 1, further including applying a conformed layer of dielectric material to completely cover said released microstructure.

3. The process of claim 1, further including the step of metallizing selected regions of said microstructure and said substrate vertical walls.

4. The process of claim 1, further including forming a membrane over said released microstructure to provide a movable membrane.

5. The process of claim 1, wherein the step of transferring said pattern by ion beam etching includes chemically reactive ion beam etching.

6. The process of claim 1, wherein the step of transferring said pattern by ion beam etching includes reactive ion beam etching.

7. The process of claim 1, wherein the step of providing a substrate comprises selecting a single crystal material from the group consisting of gallium arsenide, silicon germanium, and indium phosphide.

8. The process of claim 1, wherein the step of providing a substrate comprises selecting a graded index, separate confinement herterostructure quantum well material.

9. The process of claim 1, wherein the step of depositing said first layer on said top surface of said substrate comprises depositing a layer having a thermal expansion matching that of said substrate material.

10. The process of claim 1, wherein the step of forming a pattern in said dielectric stack includes depositing a photoresist on said second layer, optically producing a mask pattern in said photoresist, and transferring said mask pattern by reactive ion etching to the dielectric stack through the mask pattern.

11. The process of claim 10, wherein the step of transferring said pattern to said substrate by ion beam etching includes forming trenches having smooth, vertical side walls to a depth of about 10 $\mu$m and smooth bottom walls in said trenches.

12. The process of claim 11, further including, after the step of forming said third layer, metallizing selected regions of said microstructure by depositing on said third layer a conformal layer of metal, masking said metal layer, and removing unmasked metal, thereby providing selected metallized regions and selected regions not coveted by said metal layer, said metal layer being removed at least from the bottoms of said trenches.

13. The process of claim 12, wherein the step of metallizing is preceded by masking, patterning and etching said third dielectric layer to provided selected contact windows therein to expose the substrate and to allow said metal to contact said substrate at selected locations.

14. The process of claim 13, wherein the step of etching back said third layer includes etching said third layer in regions not covered by said metal layer, including the bottom walls of said trenches, while leaving said third layer in place on at least parts of the side walls of said trenches, and thereafter etching the substrate at the bottoms of the trenches, deepening the trenches and laterally undercutting the mesas formed in the substrate to isolate top portions of the mesas to thereby produce said released microstructure.

15. The process of claim 14, further including applying a conformal layer of dielectric material to completely cover said released microstructure.

16. The process of claim 15, wherein the step of providing a substrate comprises selecting a gallium arsenide material.

17. The process of claim 1, wherein the step of forming a pattern includes defining a grid of mesas to be released, and further including the step of depositing a continuous membrane on top surfaces of said mesas, the membrane spanning said trenches between adjacent mesas.

18. The process of claim 1, wherein the step of forming a third dielectric layer includes depositing nitride.

* * * * *

UNITED STATES PATENT AND TRADEMARK OFFICE
CERTIFICATE OF CORRECTION

PATENT NO. : 5,393,375
DATED : February 28, 1995
INVENTOR(S) : MacDonald et al

It is certified that error appears in the above-indentified patent and that said Letters Patent is hereby corrected as shown below:

Column 10, claim 12, line 58 change:

"coveted" to --covered--

Signed and Sealed this

Sixteenth Day of May, 1995

Attest:

BRUCE LEHMAN

*Attesting Officer*  *Commissioner of Patents and Trademarks*